United States Patent
Xu

(10) Patent No.: US 6,552,599 B1
(45) Date of Patent: Apr. 22, 2003

(54) DIODE CIRCUIT WITH IDEAL DIODE CHARACTERISTIC

(75) Inventor: Chihao Xu, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/248,448

(22) Filed: Feb. 11, 1999

(30) Foreign Application Priority Data

Feb. 11, 1998 (DE) .......................................... 198 05 491

(51) Int. Cl.[7] .............................................. H03K 17/74
(52) U.S. Cl. ........................ 327/493; 327/419; 327/434; 327/583
(58) Field of Search ................. 327/108–112, 374–377, 327/404, 419, 427, 434, 365, 493, 502–505, 583, 584, 403, 312, 362, 421; 257/173, 355, 363

(56) References Cited

U.S. PATENT DOCUMENTS

| | | | | |
|---|---|---|---|---|
| 4,459,498 A | * | 7/1984 | Stengl et al. ............... | 327/436 |
| 5,272,392 A | * | 12/1993 | Wong et al. ................. | 327/109 |
| 5,764,088 A | * | 6/1998 | Lavieville et al. .......... | 327/110 |
| 5,798,666 A | * | 8/1998 | Tihanyi ....................... | 327/377 |
| 5,912,496 A | * | 6/1999 | Ohashi ........................ | 257/355 |
| 6,169,439 B1 | * | 1/2001 | Teggatz et al. ............. | 327/309 |

OTHER PUBLICATIONS

"Feldeffekt–Transistoren", J. Wustehube, Valvo GmbH, Hamburg, Apr., 1968, pp. 88–91.*
"Current Generators", B. L. Hart, Wireless Worl, Oct. 1970, pp. 511–514.

* cited by examiner

Primary Examiner—Timothy P. Callahan
Assistant Examiner—Minh Nguyen
(74) Attorney, Agent, or Firm—Laurence A. Greenberg; Werner H. Stemer; Gregory L. Mayback

(57) ABSTRACT

A circuit configuration produces an at least approximately ideal diode characteristic on the basis of a diode. A power MOSFET has a control path connected in parallel with the diode, a load path forming connection terminals of the ideal diode, and a gate connection to which a predetermined voltage potential is applied, for turning on the power MOSFET in the forward-bias direction of the diode and turning off the power MOSFET in the reverse-bias direction.

9 Claims, 2 Drawing Sheets

DIODE CIRCUIT WITH IDEAL DIODE CHARACTERISTIC

BACKGROUND OF THE INVENTION

Field of the Invention

The present invention relates to a circuit configuration for producing an at least approximately ideal diode characteristic on the basis of a diode.

The function of a diode is used in a large number of practical applications. For example, a diode may be connected in antiseries with a power MOSFET, in order to prohibit current in the reverse flow direction in a circuit containing a power MOSFET which permits current to flow in the reverse direction.

A diode is, for example, configured as a PN diode, which produces a large power loss because of the required bias voltage or threshold voltage. That problem of a PN diode can, for example, be mitigated through the use of a Schottky diode, but not fully eliminated. Furthermore, a disadvantage of Schottky diodes is that they have high leakage currents at high temperature.

In other words, diodes have a characteristic which deviates from the ideal of a resistor characteristic due to the threshold voltage, and therefore unavoidably result in a power loss.

SUMMARY OF THE INVENTION

It is accordingly an object of the invention to provide a diode circuit with an ideal diode characteristic, which overcomes the herein afore-mentioned disadvantages of the heretofore-known devices of this general type and with which a diode characteristic matched to a profile of a resistor characteristic can be produced for a diode.

With the foregoing and other objects in view there is provided, in accordance with the invention, a circuit configuration for producing an at least approximately ideal diode characteristic, comprising a diode having a forward-bias direction and a reverse-bias direction; and a power MOSFET having a control path connected in parallel with the diode, a load path forming ideal diode connection terminals, and a gate connection receiving a predetermined voltage potential for turning on the power MOSFET in the forward-bias direction of the diode and turning off the power MOSFET in the reverse-bias direction of the diode.

In accordance with another feature of the invention, there is provided a Zener diode connected between the gate connection of the power MOSFET and the diode.

The invention thus proposes to overcome the problem of the diode threshold voltage by using a power MOSFET which is connected in parallel with the diode in the third quadrant. By virtue of this measure, the output characteristic of the diode, or of this diode circuit, is similar to the characteristic of a resistor. Therefore, the voltage drop across the diode, i.e. the product of current times resistance, can be considerably smaller with suitable dimensioning than the diode threshold voltage of a conventional or conventionally used diode. This advantageously leads to a reduction in the power loss.

It will be understood that the power MOSFET used according to the invention in the diode circuit must have an activation threshold voltage. The solution according to the invention is turning the power MOSFET on in the forward-bias direction of the diode and turning it off in the reverse-bias direction, through the use of which a virtually ideal diode characteristic can be obtained.

The invention also provides a measuring instrument based on the diode circuit according to the invention for measuring a load current without the disadvantage of a shunt resistor which was heretofore needed for that purpose. Therefore, in accordance with a further feature of the invention, there is provided a supply voltage source having terminals, and a resistor connected between one of the terminals of the supply voltage source and the gate connection of the power MOSFET. This proposal for such a measuring instrument has the advantage of considerably reducing costs, power loss, number of components required, and overall size and weight of the measuring instrument compared with the prior art.

In accordance with an added feature of the invention, the power MOSFET has a source and a drain, and the drain of the power MOSFET is connected to a voltage reference point; the diode has two electrodes, and one of the electrodes of the diode is connected to the voltage reference point; a Zener diode is connected in antiseries between the other of the electrodes of the diode and the gate connection of the power MOSFET; a supply voltage source has a terminal connected to the source of the power MOSFET; a resistor is connected between the Zener diode and the terminal of the supply voltage source; and optionally there is provided a series circuit having a load and a switching device, the series circuit connected between the source of the power MOSFET and the terminal of the supply voltage source.

In accordance with an additional feature of the invention, there is provided a further MOSFET forming current sensor cells for determining a load current flowing through the load, the further MOSFET having a drain connected to the voltage reference point connected to the power MOSFET, a gate connected to the gate connection of the power MOSFET, and a source; an NMOS transistor having a source connected to the source of the further MOSFET, a drain connected to the terminal of the supply voltage source, and a gate; and a differential amplifier having an output connected to the gate of the NMOS transistor, one input connected to the source of the power MOSFET, and another input connected to the source of the further MOSFET.

In accordance with yet another feature of the invention, there is provided a PMOS current mirror circuit supplying the drain of the NMOS transistor with current.

In accordance with yet a further feature of the invention, there is provided a rectifier diode connected in series with the PMOS current mirror circuit.

In accordance with a concomitant feature of the invention, the further MOSFET forming the current sensor cells and the power MOSFET are made on the same substrate.

Other features which are considered as characteristic for the invention are set forth in the appended claims.

Although the invention is illustrated and described herein as embodied in a diode circuit with an ideal diode characteristic, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
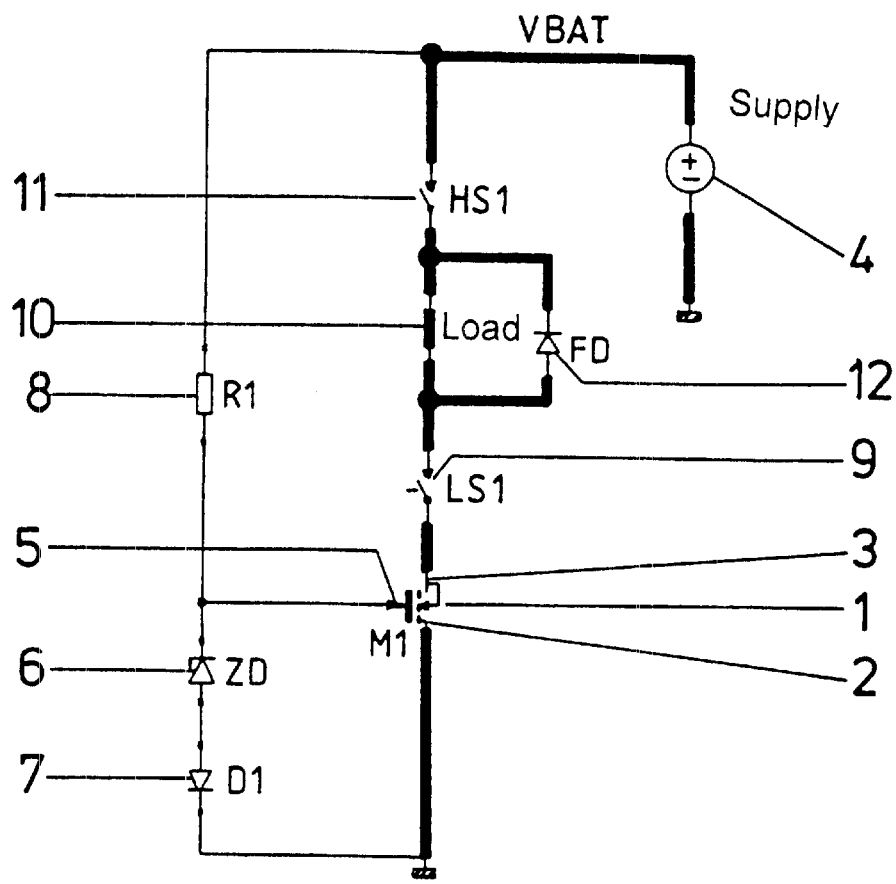
FIG. 1 is a schematic diagram of a first embodiment of a diode circuit according to the invention for driving a load.

Referring now to the figures of the drawings in detail and first, particularly, to FIG. 1 thereof, there is seen a circuit which includes a power MOSFET (M1) 1 having a drain 2 connected to a voltage reference point, preferably to ground. A source 3 of the power MOSFET 1 is connected through a series circuit of two switches 9, 11 to another voltage reference point, preferably to a positive voltage VBAT of a current supply source 4. A load 10 is connected between the two switches 9, 11. A gate 5 of the MOSFET 1 is connected to a cathode of a Zener diode (ZD) 6 having an anode that is connected through a diode 7 (D1) to ground. In this case, the diode 7 has an anode connected to the anode of the Zener diode 6 and a cathode connected to ground. A resistor (R1) 8 has one terminal connected to a connection point between the Zener diode 6 and the gate 5 of the power MOSFET 1. The resistor 8 has another terminal connected to the VBAT connection of the current supply source 4.

A freewheeling diode (FD) 12 is connected in parallel with the load 10. This freewheeling diode has an anode connection applied to a connection point between the switch 9 and the load 10, and a cathode connection applied to a connection point between the load 10 and the switch 11. The switch 11 is a high side switch (HS1) and the switch 9 is a low side switch (LS1).

In the circuit shown in FIG. 1, the power MOSFET 1 is used to overcome the problem of a high diode threshold voltage or bias which is needed to turn on the diode 7. Specifically, the power MOSFET 1 is switched on in parallel with the diode 7 in the third quadrant. This means that the power MOSFET 1 is always deliberately switched on whenever the diode 7 is on.

Figure 3:
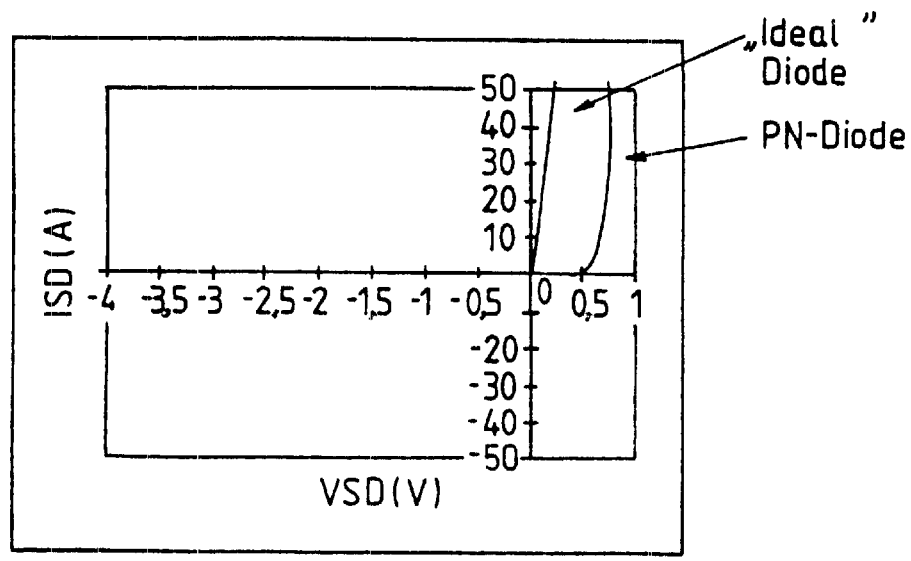
FIG. 3 is a graph showing a comparison between a characteristic of a conventional PN diode and the diode circuit according to the invention with an ideal diode characteristic.

The output characteristic of the overall diode circuit behaves as a resistor, and thus has at least essentially a resistor characteristic as represented in FIG. 3 by a diode characteristic profile, that is referred to as "ideal diode". In comparison with this, FIG. 3 also shows the characteristic of a conventional PN diode curve profile, which is referred to as "PN diode". Such a conventional diode has a comparatively high power loss.

In other words, the measure according to the invention for obtaining an ideal diode characteristic, approximating a resistor characteristic, is turning on the power MOSFET 1 in the forward-bias direction of the diode 7 and turning off in the reverse-bias direction.

In the circuit schematically shown in FIG. 1, the voltage at the gate 5 is normally higher than the voltage applied to the drain 2 by the Zener voltage of the Zener diode 6 plus the threshold voltage of the diode 7. A load current which is activated by the high side switch 11 and/or the low side switch 9 and flows through the load 10 produces only a relatively small power loss at the power MOSFET 1.

In the case of misconnection, that is to say when the current supply source 4 is connected the wrong way round to the circuit and the voltage VBAT is therefore unintentionally connected to the drain 2 of the power MOSFET 1, the switches 9 and 11 which are, for example, MOSFETs, cannot prevent current from flowing through the load 10 in the reverse-bias direction because of reverse diodes which have been installed, but are not shown in FIG. 1. A further problem is the commonly employed, freewheeling diode 12, which is also provided in the present circuit, for the load 10 or a similar such component, for example a bridge. In this case, the current in the reverse-bias direction is not limited unless countermeasures are taken, which in the present case are in the form of the diode circuit according to the invention.

With the circuit according to FIG. 1, the gate 5 of the power MOSFET 1, in the event of misconnection, is decoupled from the higher potential applied to the power MOSFET 1 because of the freewheeling diode 12. The resistor 8 takes the gate 5 of the power MOSFET 1 to the lowest potential, so that the power MOSFET 1 blocks the flow of current produced by the higher voltage potential, i.e. by this MOSFET fulfilling an ideal diode function.

In a large number of applications of load supply circuits, the relevant circuit contains a grounded shunt resistor for measuring a load current. Since the entire load current flows through that shunt resistor, it must be capable of converting the load into heat without being destroyed. In other words, the shunt resistor used for measuring the load current must be a large and expensive resistor, and one which therefore basically has the disadvantage of large space requirement and weight and high cost. That shunt resistor further has the disadvantage of having an unfavorable effect on the signal waveform.

Figure 2:
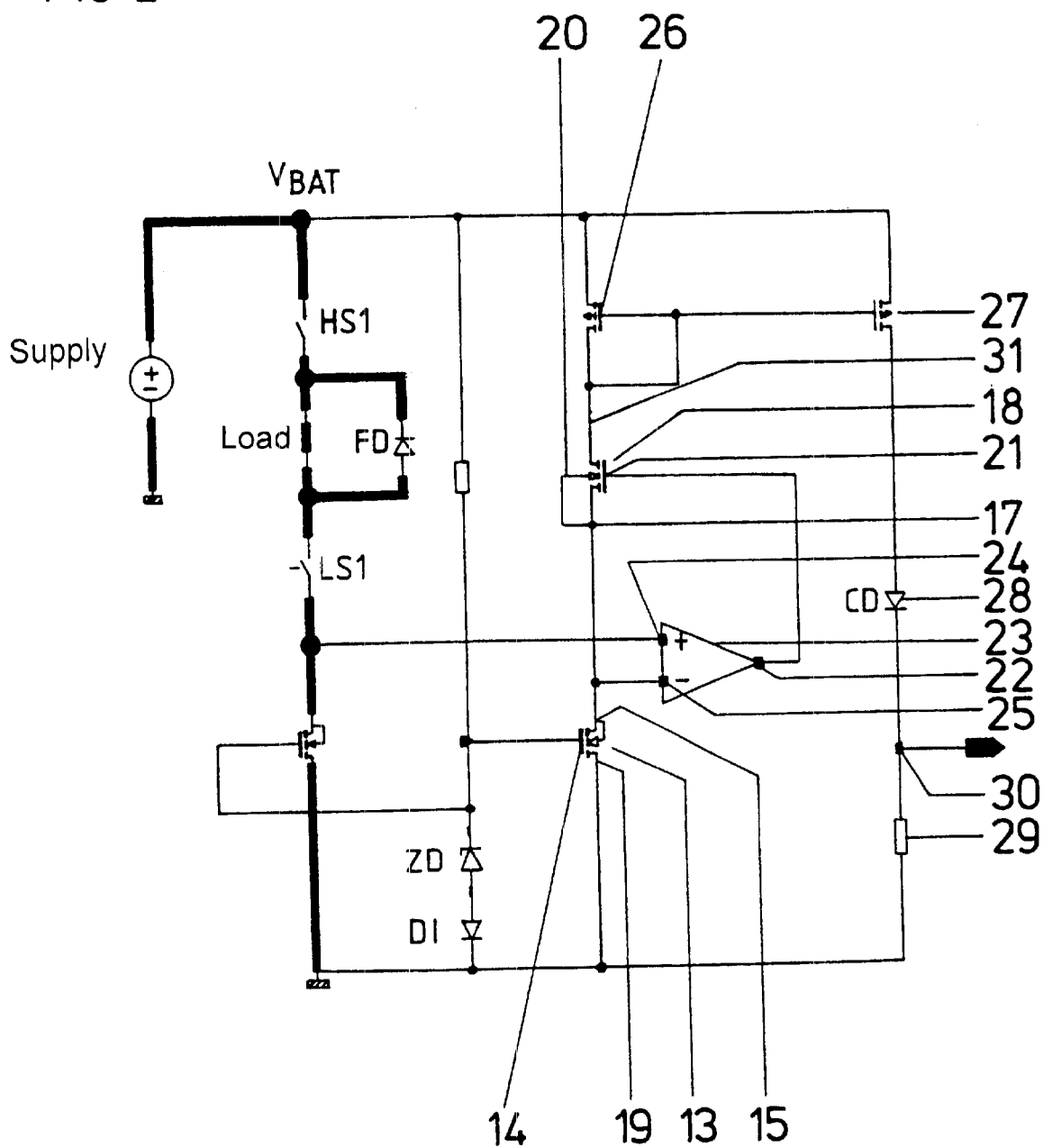
FIG. 2 is a schematic diagram of the diode circuit of FIG. 1 with an additional circuit for determining a load current with the aid of current sensor cells.

FIG. 2 shows an alternative to the conventional manner of measuring current using a shunt resistor, based on the circuit in FIG. 1 which includes the diode circuit according to the invention. The components of the circuit in FIG. 2 which correspond to those in FIG. 1 are denoted in FIG. 2 by the same reference numerals as in FIG. 1.

Starting with the circuit in FIG. 1, the circuit in FIG. 2 for measuring load current is based on the concept of providing the power MOSFET 1 with a plurality of sensor cells for detecting current, and of using a special drive or evaluation circuit to determine the load current. In the embodiment shown in FIG. 2, a further MOSFET 13, which is preferably made on the same substrate as the power MOSFET 1 of the diode circuit according to the invention, is used as the sensor cell. A gate 14 of the further MOSFET 13 is connected to the gate 5 of the power MOSFET 1. A source 15 of the further MOSFET 13 is connected to a source 17 of an NMOS transistor 18, while a drain 19 of the further MOSFET 13 is grounded. The source 17 of the NMOS transistor 18 is connected to a substrate connection 20 of the NMOS transistor 18. A gate 21 of this NMOS transistor 18 is connected to an output 22 of a differential amplifier 23. The differential amplifier 23 is configured as an operational amplifier, has a non-inverting input 24 connected to the source 3 of the power MOSFET 1 and has an inverting input 25 connected to the source 15 of the further MOSFET 13.

The NMOS transistor 18 is supplied from a current mirror circuit which will be explained in more detail below.

An output signal of the differential amplifier 23 controls the gate 21 of the NMOS transistor 18 in such a way that the source 15 of the further MOSFET 13 is at the same potential as the source 3 of the power MOSFET 1. The current through the further MOSFET 13, which forms the cell for sensing the current, is therefore proportional to the load current through the load 10, or the power MOSFET 1, and can thus be used to determine the load current.

As mentioned above, the current through the further MOSFET 13 and the NMOS transistor 18 is taken from a PMOS current mirror circuit. That circuit includes a PMOS transistor 26 and a PMOS transistor 27 which are grounded for the sake of simple evaluation. To this end, the load path of the PMOS transistor 26 is connected between the terminal VBAT and a drain 31 of the MOSFET 18. The PMOS transistor 26 has a gate and a drain which are connected together to the gate of the PMOS transistor 27. The load path of the PMOS transistor 27 is connected between the terminal VBAT and an anode connection of a rectifier diode (CD) 28.

Since no current flows through the drain/bulk diode of the PMOS transistor 27 in the case of misconnection, the rectifier diode 28, which is grounded through a resistor 29, is connected in series with this PMOS transistor 27. Specifically, the diode 28 has a cathode connection connected to a connection of the resistor 29 and an anode connection connected to a drain connection of the PMOS transistor 27. A measuring connection 30 is provided between the diode 28 and the resistor 29. It is possible by using the measuring connection 30 to measure a sensor current which is proportional to the load current through the load 10, is orders of magnitude less than the load current, and therefore causes negligible power loss.

The circuit in FIG. 2 can be modified within the scope of the description given above. For example, the output of the differential amplifier 23 may directly drive the gate of the PMOS transistor 26 and the gate of the PMOS transistor 27, with the input priorities being interchanged. The NMOS transistor 18 may thereby be omitted, with the gate 14 and the drain 19 of the further MOSFET being separated. However, this circuit variant does require a differential amplifier 23 which can receive the full supply voltage.

The circuit shown in FIG. 2, or its variant explained above, can be produced in monolithic form using a contemporary smart power process. A multichip solution is also beneficial for economic implementation. The MOSFET transistors 1 and 13 can be produced straightforwardly with a conventional power MOSFET process. In order to provide a flexible configuration of the voltage waveform at the measuring output 30, an external resistor may be connected in parallel with the resistor 29.

In the circuit shown in FIG. 2, the drain of the power MOSFET 1 and the drain of the further MOSFET 13 are electrically and thermally connected to the substrate of a system package, as well as to ground. Therefore, the package itself is directly grounded so that it is possible to have sufficient cooling without any insulation.

I claim:

1. A circuit configuration, comprising:
   at least two voltage supply terminals for receiving a supply voltage;
   a series circuit connected between said voltage supply terminals, said series circuit including a diode having a forward-bias direction and a reverse-bias direction and a Zener diode connected in series with said diode;
   a power MOSFET having:
      a gate connected to said series circuit, and
      a source and a drain defining a load path,
      said drain being directly connected to said series circuit; and
   at least one switch connected in series with the load path;
   said Zener diode having a cathode coupled to said gate of said power MOSFET.

2. The circuit configuration according to claim 1, wherein said Zener diode is connected between said gate of said power MOSFET and said diode.

3. The circuit configuration according to claim 1, including a resistor connected between one of said voltage supply terminals and said gate of said power MOSFET.

4. The circuit configuration according to claim 1, wherein:
   said drain of said power MOSFET is connected to a voltage reference point;
   said diode has a first electrode and a second electrode, and said first electrode of said diode is connected to the voltage reference point;
   said Zener diode is connected between said second electrode of said diode and said gate of said power MOSFET;
   said voltage supply terminals include a first voltage supply terminal and a second voltage supply terminal;
   said first voltage supply terminal is connected to the source of said power MOSFET; and
   a resistor is connected between said Zener diode and said first voltage supply terminal, said voltage reference point is connected to said second voltage supply terminal.

5. The circuit configuration according to claim 4, including an additional series circuit having a load and the switch, said additional series circuit connected between the source of said power MOSFET and said first voltage supply terminal.

6. The circuit configuration according to claim 5, comprising:
   a further MOSFET forming a current sensor cell for determining a load current flowing through the load, said further MOSFET having a drain and a source connected between said voltage terminals and a gate connected to said gate of said power MOSFET;
   said drain of said further MOSFET is connected to said voltage reference point; and further including:
      an NMOS transistor having a source connected to the source of said further MOSFET, a drain connected to said first voltage supply terminal, and a gate; and
      a differential amplifier having an output connected to the gate of said NMOS transistor, one input connected to the source of said power MOSFET, and another input connected to the source of said further MOSFET.

7. The circuit configuration according to claim 6, including a PMOS current mirror circuit supplying the drain of said NMOS transistor with current.

8. The circuit configuration according to claim 7, including a rectifier diode connected in series with said PMOS current mirror circuit.

9. The circuit configuration according to claim 6, wherein said further MOSFET forming said current sensor cell and said power MOSFET are made on the same substrate.

* * * * *